(12) United States Patent
Rutter et al.

(10) Patent No.: US 9,048,116 B2
(45) Date of Patent: Jun. 2, 2015

(54) SEMICONDUCTOR DEVICE HAVING ISOLATION TRENCHES

(71) Applicant: NXP B. V., Eindhoven (NL)

(72) Inventors: Phil Rutter, Stockport (GB); Ian Culshaw, Stockport (GB); Steven Thomas Peake, Warrington (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/682,792

(22) Filed: Nov. 21, 2012

(65) Prior Publication Data

US 2013/0146972 A1 Jun. 13, 2013

(30) Foreign Application Priority Data

Dec. 7, 2011 (EP) ...................................... 11192471

(51) Int. Cl.
*H01L 27/105* (2006.01)
*H01L 27/088* (2006.01)
*H01L 29/78* (2006.01)
*H01L 29/40* (2006.01)
*H01L 29/739* (2006.01)
*H01L 29/06* (2006.01)
H01L 29/423 (2006.01)
H01L 29/417 (2006.01)

(52) U.S. Cl.
CPC .......... *H01L 27/088* (2013.01); *H01L 29/4238* (2013.01); *H01L 29/7803* (2013.01); *H01L 29/7811* (2013.01); *H01L 29/7813* (2013.01); *H01L 29/7817* (2013.01); *H01L 29/7823* (2013.01); *H01L 29/407* (2013.01); *H01L 29/41766* (2013.01); *H01L 29/7397* (2013.01); *H01L 29/0653* (2013.01)

(58) Field of Classification Search
CPC ................. H01L 27/105; H01L 2224/49175; H01L 2924/1306
USPC ........................... 257/302, 330–334, E29.346
See application file for complete search history.

(56) References Cited

U.S. PATENT DOCUMENTS

| 5,726,474 A | 3/1998 | Miller et al. |
| 8,956,940 B2 | 2/2015 | Lui et al. |
| 2005/0224909 A1 | 10/2005 | Yamaguchi et al. |
| 2008/0290407 A1 | 11/2008 | Kusunoki et al. |
| 2009/0032875 A1 | 2/2009 | Kawaguchi et al. |

(Continued)

FOREIGN PATENT DOCUMENTS

| CN | 101312192 A | 11/2008 |
| CN | 102237279 A | 11/2011 |
| JP | 62-098670 A | 5/1987 |
| JP | 1-305576 A | 8/1989 |
| JP | 02-042764 | 3/1990 |

(Continued)

OTHER PUBLICATIONS

Maniktala, S.; "Fixing EMI Across the Board"; National Edge; 5 pages (2004).

(Continued)

*Primary Examiner* — Tran Tran

(57) ABSTRACT

A semiconductor uses an isolation trench, and one or more additional trenches to those required for isolation are provided. These additional trenches can be connected between a transistor gate and the drain to provide additional gate-drain capacitance, or else they can be used to form series impedance coupled to the transistor gate. These measures can be used separately or in combination to reduce the switching speed and thereby reduce current spikes.

11 Claims, 6 Drawing Sheets

(56) References Cited

U.S. PATENT DOCUMENTS

| | | |
|---|---|---|
| 2009/0184373 A1 | 7/2009 | Kaindl et al. |
| 2009/0321804 A1 | 12/2009 | Mauder et al. |
| 2010/0276728 A1 | 11/2010 | Hsieh |
| 2011/0024834 A1 | 2/2011 | Hull et al. |
| 2011/0233666 A1 | 9/2011 | Lui et al. |

FOREIGN PATENT DOCUMENTS

| | | |
|---|---|---|
| JP | 2001-250948 A | 9/2001 |

OTHER PUBLICATIONS

Texas Instruments; "Synchronous Buck NexFET™ Power Stage—Datasheet"; (Jun. 2011).

Extended European Search Report for application No. 11192471.8 (Jun. 21, 2012).

SEMICONDUCTOR DEVICE HAVING ISOLATION TRENCHES

CROSS-REFERENCE TO RELATED APPLICATIONS

This application claims the priority under 35 U.S.C. §119 of European patent application no. 11192471.8, filed on Dec. 7, 2011, the contents of which are incorporated by reference herein.

This invention relates to semiconductor devices and methods of manufacturing semiconductor devices, and in particular to isolated trench semiconductor FETs and methods of manufacturing the same.

An example of isolated trench semiconductor device is a trench-gate semiconductor device, in which a semiconductor body includes a source region towards a first major surface of the device, and a drain region deeper in the device. Typically the source and drain regions are doped n-type. Lying between the source and drain is a body region, which is doped p-type.

In order to turn on the device, so that it conducts an electrical current between the source and drain, a channel must be created through the p-type body region. To create the channel, a gate electrode is provided, the gate material being located close to the body region in trench in the device. The trench is typically lined with oxide, to electrically isolate the gate from the body. Providing a positive bias to the gate produces an electrical field which locally deletes the p-type body, and inverts it to become locally conducting n-type. When conducting, a low resistance (Rds(on)) is required through the device. Conventionally, this is effected by providing a short vertical channel through the body, which is relatively highly doped.

It is also known to isolate active areas of the semiconductor carrying these trench gate devices with one or more deeper isolation trenches, which form a closed shape around the active area.

As the switching performance of Power MOSFETs improve, high voltage spikes in the application become problematical. For example, in a DC-DC converter using two MOSFETs in series to create a half bridge (the midpoint being referred to as the switch node), once the gate charge of the high side device (or Control FET) is sufficiently small such that its turn on and off no longer controls the rate of change of voltage output of the switch node (i.e. the rate of change of voltage is determined by the resonant frequency of the total inductance and the COSS of the low side device and the rate of change of current is determined by total inductance) then unacceptably high voltage spikes can occur due to the non-linearity of the low side output capacitance and its reverse recovery charge.

Whilst it is beneficial to reduce Control FET switching speed to improve switching loss, if this improvement is not matched with a reduction in the circuit inductance, then high voltage spikes will result. In applications where it is not possible to reduce inductance (either due to practical limitations or customer reluctance) then a slower switching control is required.

Since newer technologies deliver both faster switching and lower cost (for the same on resistance RDS(on)) it becomes necessary to also have the capability to design products that have been intentionally slowed down.

A power MOSFET design is the combination of a large number of individual MOSFETs (or cells), each having a different switching speed related to the resistance between the gate of the MOSFET cell and the gate pad. The switching speed is related to the product of the gate resistance and the gate capacitance. This distributed gate means that at turn on, the cells with the least gate impedance will turn on first and sustain the drain current until the rest of the device has turned on. Conversely, the device will only turn off once the cells with the highest gate impedance have been turned off. For this reason, turn on is much quicker than turn off, with the result that large spikes are more likely to occur at turn on.

The effect of voltage drops across circuit inductances as the current ramps up/down in the circuit (and the different turn on and turn off speeds) means that the majority of switching loss occurs at the turn off of the MOSFET. Therefore, the ideal solution to reduce switching spikes is one that slows down the turn on of the MOSFET without having a significant impact on the turn off.

A common solution is to increase the gate resistance of the MOSFET by removing gate busbars. However, this affects the turn off switching speed (and hence efficiency) to a much greater extent than turn on and has a detrimental effect on efficiency.

A second known solution is to de-activate the fastest parts of the design (for example by omitting the source implant in this region) so it does not provide a high rate of change of current. Whilst this strategy can be successful, it is expensive as it consumes active area (i.e. it increases the on resistance RDS(on)).

According to a first aspect of the present invention, there is provided a semiconductor device comprising:

a plurality of transistors formed at an active area of semiconductor substrate, the transistors each comprising a source layer, a drain layer and a gate;

at least one isolation trench formed around the active area and having an insulator liner; and at least one further trench processed with the isolation trench and filled with the insulator liner and an electrode material, wherein a transistor gate is electrically connected to the top of the further trench, and the transistor drain is capacitively connected to the bottom of the further trench.

This arrangement forms a capacitor using a trench of the same design as an isolation trench. The capacitor is connected between the gate and drain of the transistors (which are all in parallel) and acts to slow down the switch on speed of the transistors, thereby preventing spikes. The insulator functions as a capacitor dielectric.

The number of trench capacitors and their location can be designed to provide the desired turn on characteristics of the device.

The plurality of transistors are for example connected in parallel, and there may be between 1,000,000 and 10,000,000 MOS transistors forming a single device. The electrode in the isolation trench is for example connected to the source potential.

The further trench can be outside the active area where the transistors are formed or else it can be within the active area.

The isolation trench and the further trench are for example lined with an insulator and filled with electrode material such as doped polysilicon which forms an isolation trench electrode.

In one example, the transistors comprise a semiconductor substrate defining a drain region, a drift region formed over the substrate, a semiconductor body layer formed over the drift region and a source layer formed over the semiconductor body layer, wherein the gate trench is formed in a trench which extends from the surface of the source layer down into the drift region.

The substrate can be n-type, the drift region n-type with lower doping concentration, the semiconductor body p-type and the source layer n-type.

This defines a known trench-gate structure for the transistors.

The isolation trench and the at least one further trench preferably extend from the surface of the source layer down into the drift region deeper than the gate trench.

The plurality of transistors can have their gates connected to a gate pad via a gate bus bar, with gate lines extending from the gate bus bar into the active area, wherein a series impedance is provided between the gate pad and the gate bus bar, and wherein the series impedance is formed along a second further trench processed with the isolation trench and which extends between the gate bus bar and the gate pad.

This arrangement can be used to add a series impedance to the gate, which is another mechanism by which the turn on speed can be reduced.

According to a second aspect of the invention, there is provided a semiconductor device comprising:

a plurality of transistors formed at an active area of semiconductor substrate, the transistors each comprising a source layer formed above a drain layer and a gate;

at least one isolation trench formed around the active area and having an insulator liner; and at least one further trench processed with the isolation trench and filled with the insulator liner and an electrode material, wherein the at least one further trench is connected in series between a gate pad and the gates of the transistors to provide a series gate impedance.

This arrangement forms an impedance such as a resistor using a trench of the same design as an isolation trench. The impedance is connected in series with the gates of the transistors (which are all in parallel) and again acts to slow down the switch on speed of the transistors, thereby preventing spikes. The isolation trench thus functions as a resistor.

The series impedance and the gate drain capacitance can be used in combination.

The fact that both gate drain capacitance and series gate resistance can be added in a tunable way in the same design enables a significant improvement in the design.

An embodiment of the invention will be described, by way of example only, with reference to the drawings, in which.

Figure 1:
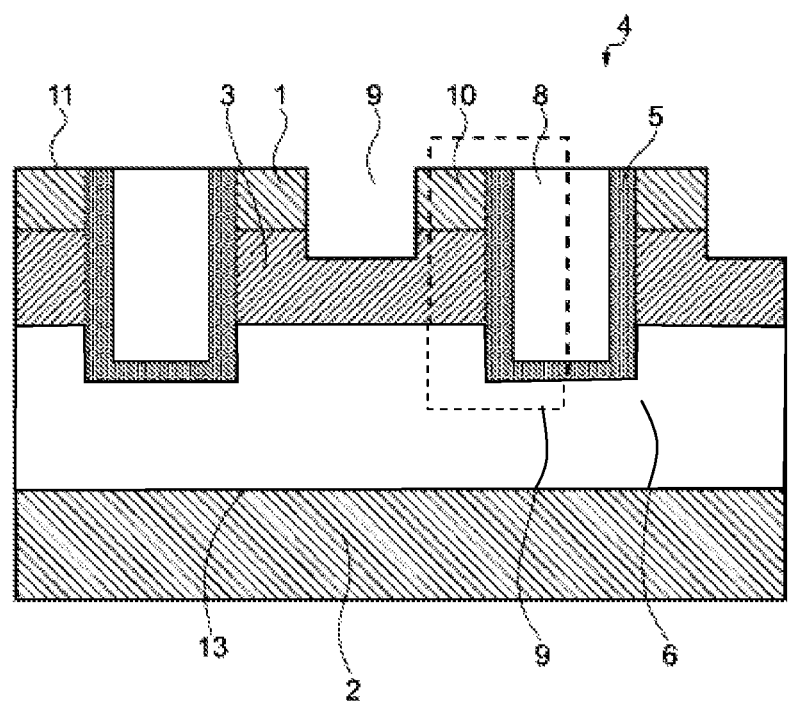
FIG. 1 shows a partial cross-section through a part of the active area of a known trench-gate semiconductor device.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments The invention provides a semiconductor device which uses an isolation trench, and one or more additional trenches to those required for isolation are provided. These additional trenches can be connected between a transistor gate and the drain to provide additional gate-drain capacitance, or else they can be used to form series impedance coupled to the transistor gate. These measures can be used separately or in combination to reduce the switching speed and thereby reduce current spikes.

FIG. 1 shows a partial cross-section through a part of a known trench-gate semiconductor device. A trench-gate semiconductor device or Trench-FET has a source region 1 adjacent its first major surface 11, and a substrate 2 which forms the drain of the device. Between the source and drain regions there are body regions 3, and drift regions 6. Extending downwards into the device from the first major surface, is a trench 4. The walls of the trench are lined with oxide 5 or other insulating material (such as silicon nitride), which serves to isolate the gate 8 which lies within trench 4 from the semiconducting layers. Wells, or moats 9, are formed through the source region 1, to allow contact to be made to the source and body regions.

In the device shown, the source region 1 and drain region 2 are n-type or n+-type. The epitaxial drift region 6 also has n-type conductivity, but has a lower n-type doping than the source or drain regions. The body region is oppositely doped, i.e. doped p-type. In use, when a forward bias is applied to the gate in the trench, a field is set up which locally depletes the p− body, adjacent the trench, of holes, and allows type inversion and thus a current to flow between the source 1 and drift 6 regions.

It is particularly convenient to use a conventional epitaxial n-drift region 6, since this provides a uniformly doped layer (or graded layer where appropriate), without the complexity or processing difficulties associated with multiple implants or high temperature anneals, to produce a suitable drift region by other means.

The invention in one aspect is based on the formation of capacitors using the processing already present to form isolation trenches. These capacitors are connected in such a way that they reduce the switching speed.

A known trench power MOSFET process uses source-connected isolation trenches under the gate pad or gate ring or gate busbars, and sometimes in a separate area than otherwise would have been active area. These isolation trenches are in addition to those required for edge termination. Only 1 or 2 isolation trenches are needed to provide edge termination, and the additional trenches are used to provide an additional drain source capacitance $C_{DS}$ (with a more linear voltage dependency) to the device to aid suppression of voltage spikes. This additional capacitance is only of benefit for low side devices of a half-bridge circuit since when ringing occurs (overshoots & subsequent damped oscillations) the drain source capacitance of a high side device is shorted by the channel.

Figure 2:
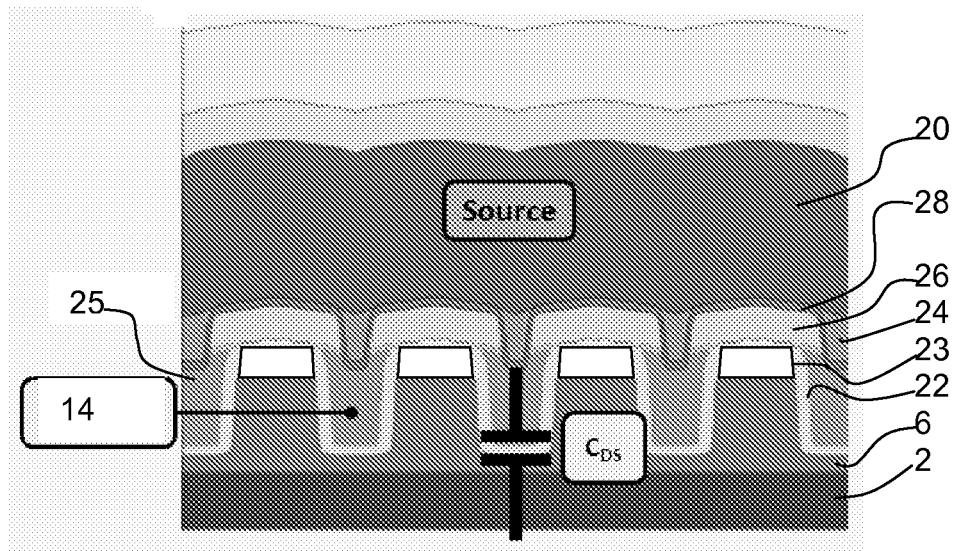
FIG. 2 shows a partial cross-section through a part of the non-active area of a known trench-gate semiconductor device in which isolation trenches are used to form drain source capacitors.

This known approach is shown in FIG. 2 which shows in cross section a known use of an isolation trench to form a drain source capacitance. FIG. 2 does not show the gate trenches, but instead shows an area outside the active area (i.e.

outside where the array of transistor cells is formed) and shows deeper isolation trenches 14 formed into the drift region 6.

The source metal is shown as 20.

The isolation trench liner is shown as 22, which is a dielectric material such as TEOS. The lined trench is filled with doped polysilicon 25. The implant region which defines the p-type semiconductor bodies is shown as 23.

A tungsten plug 24 within a tungsten liner 28 makes contact to the isolation trench 14. A TEOS dielectric 26 separates the tungsten liner 28 from the p-type body implant region 23.

The layers 20 (source metal), 24 (tungsten plug) and 28 (tungsten liner) may all be considered together as the source metal layer.

In a first aspect, the invention is based on the connection of isolation trenches (again for example located under the gate pad/ring/busbar or else outside the active area) to the gate potential instead of source potential. This will not affect the breakdown voltage of the device, and as long as the insulator thickness inside the isolation trench is thick enough (which is the case for known processes) it will not impact reliability.

Figure 3:
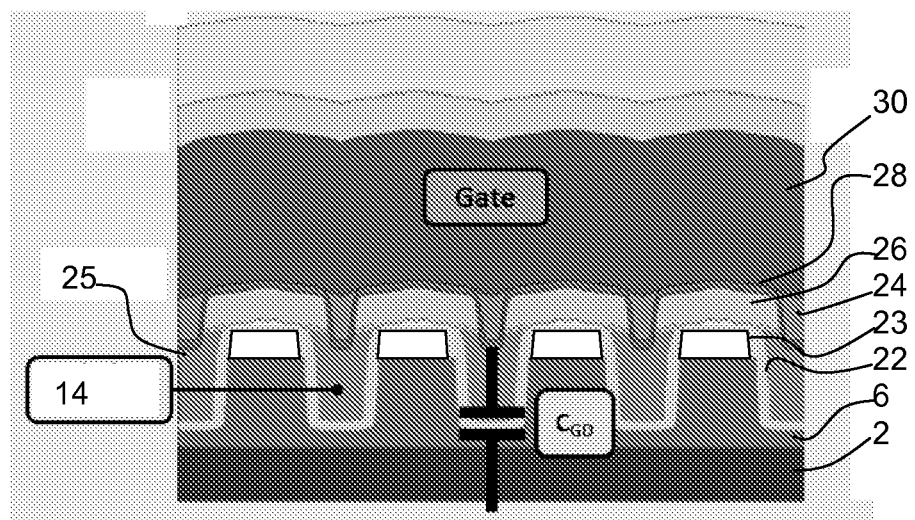
FIG. 3 shows a partial cross-section through a part of the non-active area of a semiconductor device of the invention in which isolation trenches are used to form gate drain capacitors.

FIG. 3 shows the approach of this aspect of the invention. FIG. 3 corresponds to FIG. 2, but with the gate metal 30 being used as the top contact to the isolation trenches, instead of the source metal 20. All other layers are the same.

This change in the connection of the isolation trenches converts a drain source capacitance $C_{DS}$ to a gate drain capacitance $C_{GD}$ thereby converting a fast switching technology into a slower switching technology just by layout, with no process change required.

In addition, since the isolation trenches are covered by gate metal they can be regularly connected to ensure that there is virtually no gate resistance ensuring that it will impact the charging time of the fastest parts of the die.

The solution of this aspect of the invention is a more effective utilisation of the isolation trenches in control FET designs destined for applications where the existing designs are considered too fast. The additional capacitance could be increased by removing the source contact to the body regions between the trenches, thereby ensuring they are at drain potential. A further advantage is that the ESD capability of the device will be improved small control FETs suffer from poor ESD capability.

A second aspect of the invention again makes use of isolation trench structures but to provide deliberate additional series gate resistance.

Figure 4:
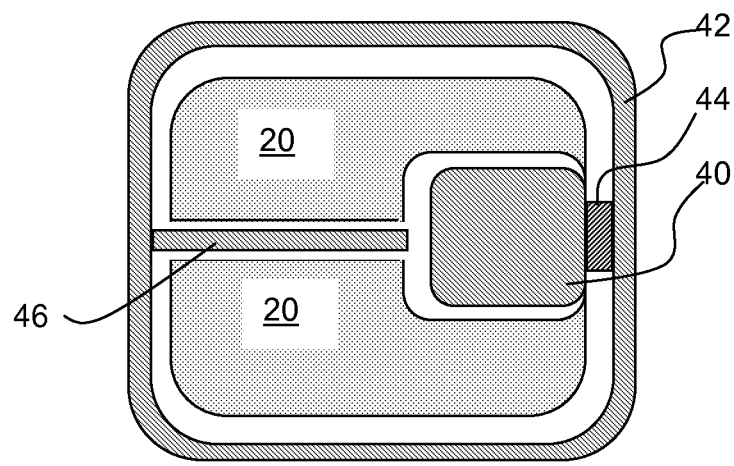
FIG. 4 shows a first example of gate conductor and series gate resistor arrangement of the invention.

FIG. 4 shows a first approach, and shows the active area.

The source area is shown as 20, and there can be thousands or millions of transistor cells beneath this area. The isolation trenches around the active area are not shown.

The gate pad 40 connects to a gate ring 42 through a series resistor 44. The gate ring 42 then connects to gate bus bars 46. The individual transistors are fed by the gate ring and gate bus bar.

Figure 5:
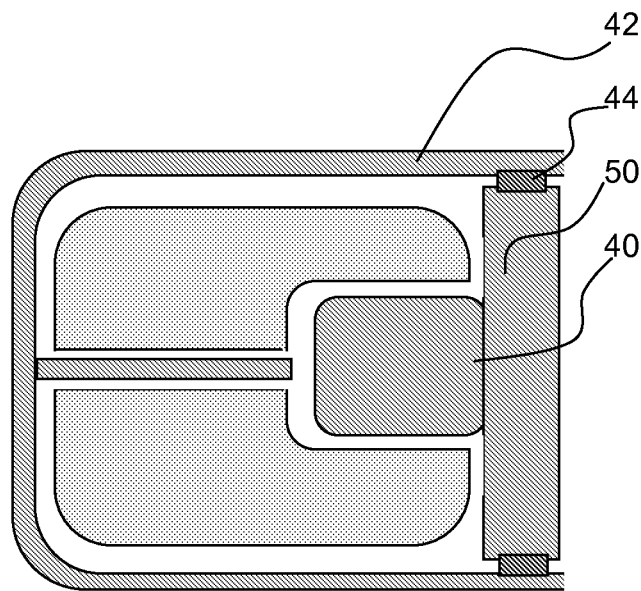
FIG. 5 shows a second example of gate conductor and series gate resistor arrangement of the invention in combination with a gate drain capacitor.

A second layout incorporating this resistor is shown in FIG. 5. A series resistance 44 is again provided between the gate pad 40 and the gate ring 42. FIG. 5 also shows area 50 used to form the gate drain capacitance as explained above. This requires a small sacrifice in active area.

The additional resistor 44 can be used when adding of the gate-drain capacitance as outlined above via isolation trenches is insufficient alone to slow down the device. The series resistance between the gate pad and the gate ring/busbar that distributes the gate signal can be used instead of removing busbars, which as described above is not very effective and has a large effect on turn off losses.

Figure 6:
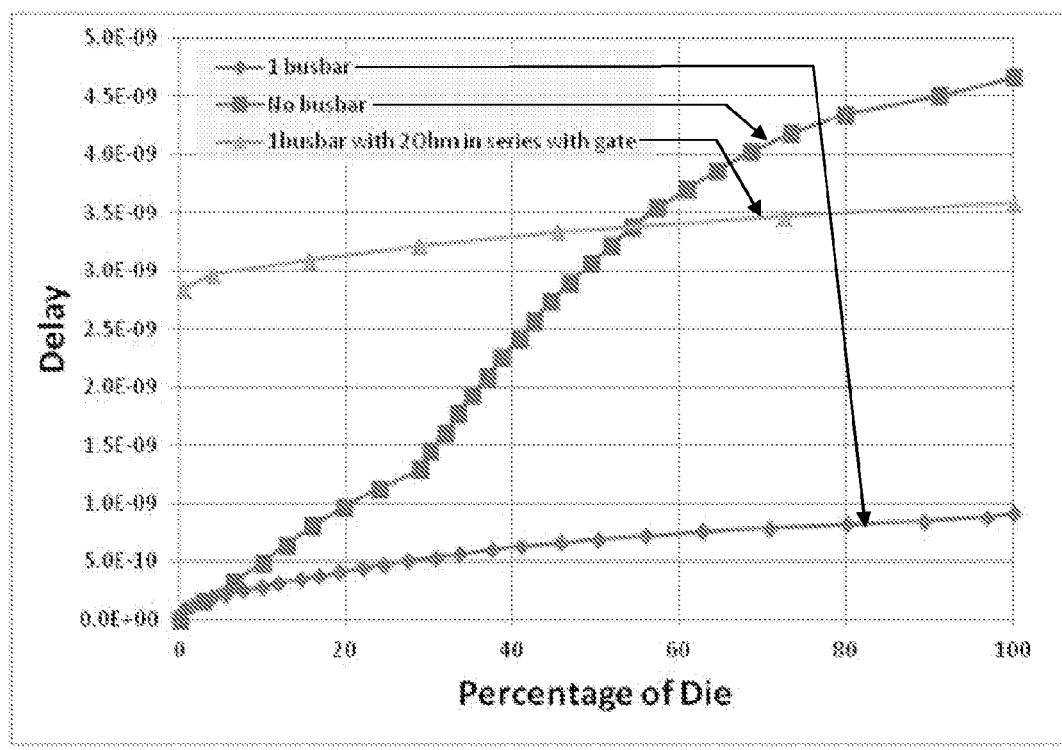
FIG. 6 shows the effect of gate resistances on the device performance.

FIG. 6 shows how the propagation delay of the gate signal across the die is affected by the inclusion and omission of the central bus bar and additional series gate resistance. It shows the signal delay as function of the percentage of the die in a cumulative manner, i.e. the time taken for a certain fraction of the die to reach a specified proportion of the input signal level. Three plots are given—one is a standard design with a single central bus bar, one is with that bus bar removed and one is with the gate series resistance added. It shows that removing bus bar does slow down turn-off but also increases non-uniformity of switching across the transistor cells. Instead of removing the bus bar, a similar slow down in switching can be achieved using the added gate resistance but with a more uniform switching of the cells.

The low resistance of the metal layer (and the process variability associated with wet etching) makes this layer unsuitable for making the required resistor (of value approx 1-2Ω), which means that it is preferred to use polysilicon, and doped polysilicon is already present in the isolation trench designs as the filling of the lined isolation trenches.

This second aspect of the invention is thus based on the formation of a polysilicon resistor using the isolation trench network. This structure is described in more detail below.

By combining the extra capacitance and the series gate resistor, the ESD capability will be improved.

The fact that both gate drain capacitance ($C_{GD}$) and series gate resistance ($R_G$) can be added in a tunable way in the same design enables a significant improvement in the design. The following equations describe how the transistor characteristics can be adjusted using these two parameters in an independent manner:

$$R_G = \alpha L/W \text{ (standard resistance proportional to length/width)}$$

$$C_{GD} = \beta \times \text{Area} = L \times W \text{ (standard capacitance proportional to area)}$$

Figure 7:
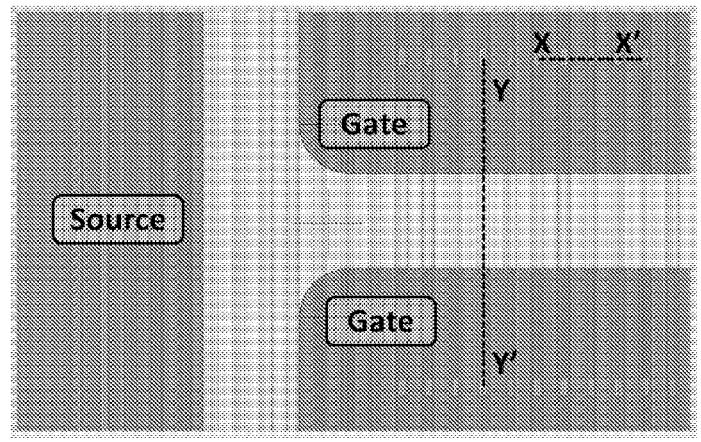
FIG. 7 shows a gate conductor and series gate resistor arrangement of the invention in plan view.

Where:

Length L=length of isolation trench (e.g. length Y-Y' in FIG. 7);

Width W=pitch of isolation trenches×number of trenches connected in parallel (e.g., Width X-X' in FIG. 7); and α and β are constants.

This means the desired $R_G$ value can be obtained by selecting the ratio of L/W.

The desired $C_{GD}$ value can then be obtained by choosing the appropriate value of L or W.

This enables impedance to be added in a tunable fashion. The gate resistance is added using subterranean isolation trenches. Further fine tuning of the added capacitance can be achieved via the depth of the isolation trench, width of the liner and doping of the drift region.

The way the series resistor is formed will now be shown in more detail.

FIG. 7 shows a plan view of the source area and two separated gate areas (for example gate pad and gate ring) between which the additional series resistor is to be formed.

Figure 8:
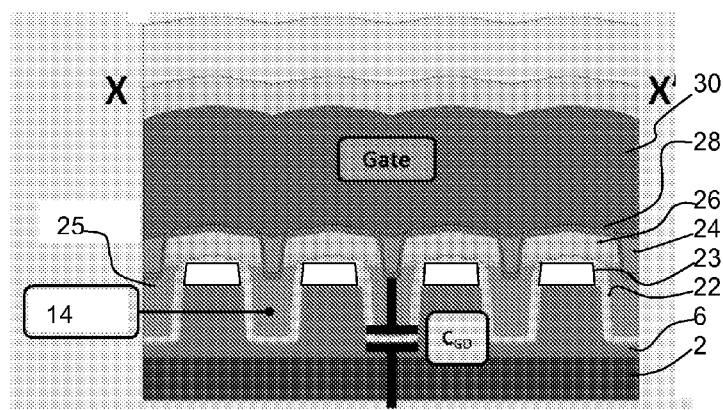
FIG. 8 shows a cross section through X-X' of FIG. 7.

FIG. 8 shows the cross section X-X' of FIG. 7 and is identical to FIG. 3. Again, this relates to an area without the transistor cells, i.e. no cells are beneath the gate pad or gate ring, but the additional gate drain capacitance is formed in this area.

Figure 9:
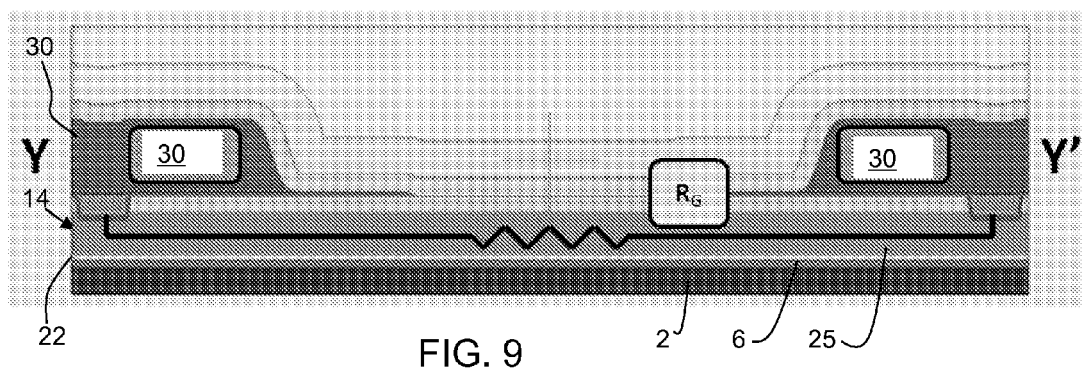
FIG. 9 shows a cross section through Y-Y' of FIG. 7.

FIG. 9 shows the cross section Y-Y' of FIG. 8. As shown, there is a disconnection between gate metal areas 30, but a connection between these gate metal areas along the polysilicon filling of the isolation trench 14, to create a series gate resistor $R_G$. The value of the resistor is varied by the distance between the connections to the gate metal areas.

The isolation trenches used for the series resistor or the gate drain capacitor are outside the active area in the examples above. However, they can be within the active area.

Figure 10:
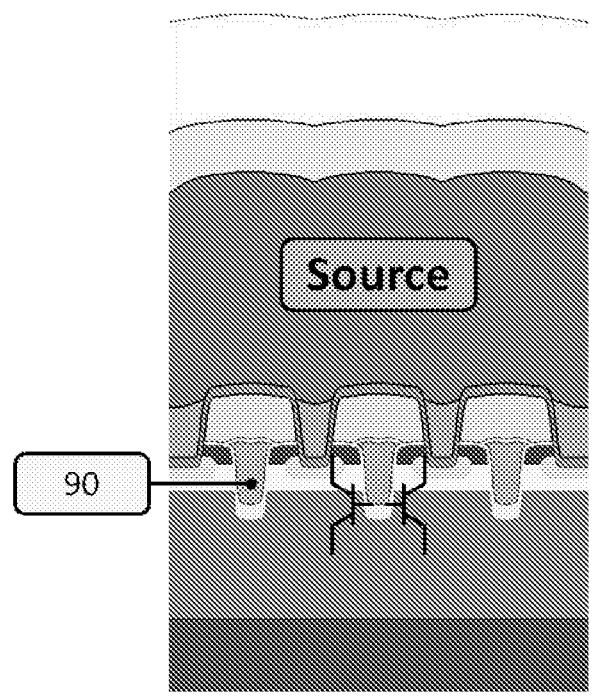
FIG. 10 shows a cross section of the active area.

FIG. 10 shows the shallower gate trenches 90 in the active area.

The invention has been described above in connection with MOSFET transistors and particularly trench gate devices. This is because trench-gate technology already includes formation of suitable trenches. The invention can apply to lateral and vertical DMOS and also IGBTs which could also use the concepts of this invention. In particular, a trench-gate structure is not required, as the invention is based on the isolation trench structure.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A semiconductor device comprising:
   a plurality of transistors formed at an active area of semiconductor substrate, the transistors each comprising a source layer, a drain layer and a gate;
   an isolation trench formed around the active area and having an insulator liner; and
   a further isolation trench formed in a drift region and filled with the insulator liner and an electrode material, wherein a transistor gate is electrically connected to a top of the further isolation trench, and the transistor drain is capacitively connected to a bottom of the further isolation trench.

2. A device as claimed in claim 1, wherein the isolation trench and the further isolation trench is filled with the insulating liner and an electrode material.

3. A device as claimed in claim 2, wherein the electrode material comprises a doped semiconductor material.

4. A device as claimed in claim 1, wherein the plurality of transistors are connected in parallel.

5. A device as claimed in claim 4, comprising between 1,000,000 and 10,000,000 MOS transistors connected in parallel.

6. A device as claimed in claim 1, wherein the further isolation trench is outside the active area where the transistors are formed.

7. A device as claimed in claim 1, wherein the plurality of transistors have their gates connected to a gate pad via a gate bus bar, with gate lines extending from the gate bus bar into the active area, wherein a series impedance is provided between the gate pad and the gate bus bar, and wherein the series impedance is formed along a second further trench processed with the isolation trench and which extends between the gate bus bar and the gate pad.

8. A device as claimed in claim 1, wherein the gate of each transistor is formed in a gate trench, and wherein the isolation trench is deeper than the gate trenches.

9. A device as claimed in claim 8, wherein the transistors comprise a semiconductor substrate defining a drain region, the drift region formed over the substrate, a semiconductor body layer formed over the drift region and a source layer formed at the semiconductor body layer, wherein the gate trench is formed in a trench which extends from the surface of the source layer down into the drift region.

10. A device as claimed in claim 9, wherein the isolation trench and the at least one further isolation trench extend from the surface of the source layer down into the drift region deeper than the gate trench.

11. A device as claimed in claim 9, wherein the substrate is n type, the drift region is n-type with lower doping concentration, the semiconductor body is p type and the source layer is n type.

* * * * *